(12) United States Patent
Jamieson et al.

(10) Patent No.: US 11,941,489 B2
(45) Date of Patent: Mar. 26, 2024

(54) QUANTUM BELIEF PROPAGATION FOR LOW DENSITY PARITY CHECKS

(71) Applicant: Trustees of Princeton University, Princeton, NJ (US)

(72) Inventors: Kyle Jamieson, Princeton, NJ (US); Sai Srikar Kasi, Princeton, NJ (US)

(73) Assignee: TRUSTEES OF PRINCETON UNIVERSITY, Princeton, NJ (US)

( * ) Notice: Subject to any disclaimer, the term of this patent is extended or adjusted under 35 U.S.C. 154(b) by 192 days.

(21) Appl. No.: 17/606,962

(22) PCT Filed: May 11, 2020

(86) PCT No.: PCT/US2020/032380
§ 371 (c)(1),
(2) Date: Oct. 27, 2021

(87) PCT Pub. No.: WO2020/227716
PCT Pub. Date: Nov. 12, 2020

(65) Prior Publication Data
US 2022/0215284 A1    Jul. 7, 2022

Related U.S. Application Data

(60) Provisional application No. 62/845,377, filed on May 9, 2019.

(51) Int. Cl.
*G06N 10/70* (2022.01)
*H03M 13/11* (2006.01)

(52) U.S. Cl.
CPC ........ *G06N 10/70* (2022.01); *H03M 13/1154* (2013.01)

(58) Field of Classification Search
CPC .................. H03M 13/1154; G06N 10/70
See application file for complete search history.

(56) References Cited

U.S. PATENT DOCUMENTS 7,003,715 B1 * 2/2006 Thurston ............. H03M 13/158
714/785
8,069,015 B2 * 11/2011 Chugg ................. H04B 1/7183
714/781

(Continued)

FOREIGN PATENT DOCUMENTS

WO    2018062660    4/2018

OTHER PUBLICATIONS

A. Amaricai, O. Boncalo. "Design trade-offs for fpga implementation of ldpc decoders." Field: Programmable Gate Array, 105, 2017.

(Continued)

*Primary Examiner* — Guy J Lamarre
(74) *Attorney, Agent, or Firm* — FisherBroyles, LLP

(57) ABSTRACT

Systems and methods herein provide for error correction via Low Density Parity Check (LDPC) coding. In one embodiment, a system includes a data buffer operable to receive a block of Low Density Parity Check (LDPC) encoded data. The system also includes a processor operable to reduce a belief propagation algorithm used to encode the LDPC encoded data into a quadratic polynomial, to embed the quadratic polynomial onto a plurality of quantum bits (qubits), and to decode the block of LDPC encoded data via the qubits.

21 Claims, 14 Drawing Sheets

(56) References Cited

U.S. PATENT DOCUMENTS

| | | | | |
|---|---|---|---|---|
| 10,511,549 | B2* | 12/2019 | Healey | H04L 1/0041 |
| 2004/0247156 | A1* | 12/2004 | Otsuki | G06T 1/0028 |
| | | | | 375/E7.184 |
| 2008/0065573 | A1* | 3/2008 | Macready | G06N 7/08 |
| | | | | 706/19 |
| 2012/0011419 | A1* | 1/2012 | Araki | H03M 13/1515 |
| | | | | 714/784 |
| 2014/0365843 | A1* | 12/2014 | Ashikhmin | G06F 11/10 |
| | | | | 714/758 |
| 2018/0350180 | A1* | 12/2018 | Onischuk | G07C 13/00 |

OTHER PUBLICATIONS

A. Checko, H. L. Christiansen, Y. Yan, L. Scolari, G. Kardaras, M. S. Berger, L. Dittmann. Cloud RAN for mobile networks—a technology overview. IEEE Communications Surveys Tutorials, 17(1), 405-426, 2015. doi:10.1109/COMST.2014.2355255.

A. D. King, J. Carrasquilla, J. Raymond, I. Ozfidan, E. Andriyash, A. Berkley, M. Reis, T. Lanting, R. Harris, F. Altomare, et al. Observation of topological phenomena in a programmable lattice of 1,800 qubits. Nature, 560(7719), 456, 2018.

A. Lucas. Ising formulations of many NP problems. Frontiers in Physics, 2, 5, 2014. doi:10.3389/fphy.2014.00005.

A. Morello, V. Mignone. DVB-S2: The second generation standard for satellite broad-band services. Proc. of the IEEE, 94(1), 210-227, 2006.

A. O'Dea, T. T. Pham. Telemetry data decoding. Tech. Rep. 810-005-208, Jet Propulsion Laboratory, 2013.

A. Orlitsky, R. Urbanke, K. Viswanathan, J. Zhang. Stopping sets and the girth of tanner graphs. Information Theory, 2002. Proceedings. 2002 IEEE International Symposium on, 2. IEEE, 2002.

B. Lackey. A belief propagation algorithm based on domain decomposition. arXiv preprint arXiv:1810.10005, 2018.

C. Berrou, A. Glavieux, P. Thitimajshima. Near Shannon limit error-correcting coding and decoding: Turbo-codes. IEEE ICC, vol. 2, 1064-1070. IEEE, 1993.

C. C. McGeoch, C. Wang. Experimental evaluation of an adiabiatic quantum system for combinatorial optimization. ACM International Conf. on Computing Frontiers, 23, 2013.

C. C. McGeoch. Adiabatic quantum computation and quantum annealing: Theory and practice. Synthesis Lectures on Quantum Computing, 5(2), 1-93, 2014.

C. E. Shannon. A mathematical theory of communication. Bell Systems Technical Journal, 27(3), 379-423, 1948.

D-Wave Hybrid Solver Service: An Overview, Feb. 25, 2020.

D-Wave Systems , D-Wave Solver Properties and Parameters Reference, Dec. 7, 2021.

D-Wave Systems White Paper Series 2017. Computational Power Consumption and Speedup.

D-Wave Systems White Paper Series 2019. Next-Generation Topology of D-Wave Quantum Processors.

D. E. Hocevar. A reduced complexity decoder architecture via layered decoding of LDPC codes. IEEE Workshop on Signal Processing Systems, 107-112. IEEE, 2004.

D. Halperin, W. Hu, A. Sheth, D. Wetherall. Tool release: Gathering 802.11 n traces with channel state information. ACM SIGCOMM Computer Communication Review, 41(1), 53-53, 2011.

D. J. MacKay. Good error-correcting codes based on very sparse matrices. IEEE Trans. on Information Theory, 45(2), 399-431, 1999.

E. Farhi, J. Goldstone, S. Gutmann, M. Sipser. Quantum computation by adiabatic evolution. arXiv:quant-ph/0001106, 2000.

ETSI Standard EN 302 307: Digital Video Broadcasting; Second generation framing structure, channel coding and modulation systems for Broadcasting, Interactive Services, News Gathering and other broadband satellite applications (DVB-S2), 2009.

G. A. Margulis. Explicit constructions of graphs without short cycles and low density codes. Combinatorica, 2(1), 71-78, 1982.

H. Ishikawa. Higher-order clique reduction in binary graph cut. IEEE CVPR, 2993-3000, 2009.

IEEE Standard 802.11: Wireless LAN Medium Access and Physical Layer Specifications, 2012.

International Preliminary Report on Patentability dated Nov. 2, 2021, in International Application No. PCT/US2020/032380.

International Search Report dated Jul. 29, 2020, in International Application No. PCT/US2020/032380.

J. Cai, W. G. Macready, A. Roy. A practical heuristic for finding graph minors. arXiv preprint arXiv:1406.2741, 2014.

J. F. Kingman. Random discrete distributions. Journal of the Royal Statistical Society. Series B (Methodological), 1-22, 1975.

J. Lu, J. M. Moura. Structured ldpc codes for high-density recording: large girth and low error floor. IEEE transactions on magnetics, 42(2), 208-213, 2006.

J. Preskill. Quantum computing in the nisq era and beyond. Quantum, 2, 79, 2018.

J. Teubner, R. Mueller, G. Alonso. Fpga acceleration for the frequent item problem. 2010 IEEE 26th International Conference on Data Engineering (ICDE 2010), 669-680. IEEE, 2010.

J. Zhao, F. Zarkeshvari, A. H. Banihashemi. On implementation of min-sum algorithm and its modifications for decoding low-density parity-check (ldpc) codes. IEEE transactions on communications, 53(4), 549-554, 2005.

K. Andrews, S. Dolinar, D. Divsalar, J. Thorpe. Design of low-density parity-check (LDPC) codes for deep-space applications. Tech. Rep. 42-159, NASA JPL, 2004.

K. Sundaresan, M. Y. Arslan, S. Singh, S. Rangarajan, S. V. Krishnamurthy. Fluidnet: A flexible cloud-based radio access network for small cells. MobiCom, 2013. doi:10.1145/2500423.2500435.

K. Sundaresan. Cloud-driven architectures for next generation small cell networks. ACM MobiArch Workshop, 2013. doi:10.1145/2505906.2511048.

M. H. Amin. Searching for quantum speedup in quasistatic quantum annealers. Physical Review A, 92(5), 052,323, 2015.

M. Karkooti, P. Radosavljevic, J. R. Cavallaro. Configurable, high throughput, irregular LDPC decoder architecture: Tradeoff analysis and implementation. IEEE ASAP Conf., 360-367, 2006.

M. Kim, D. Venturelli, K. Jamieson. Leveraging quantum annealing for large mimo processing in centralized radio access networks. Proceedings of the ACM Special Interest Group on Data Communication, 241-255. ACM, 2019.

M. W. Johnson, M. H. S. Amin, S. Gildert, T. Lanting, F. Hamze, N. Dickson, R. Harris, A. J. Berkley, J. Johansson, P. Bunyk, E. M. Chapple, C. Enderud, J. P. Hilton, K. Karimi, E. Ladizinsky, N. Ladizinsky, T. Oh, I. Perminov, C. Rich, M. C. Thom, E. Tolkacheva, C. J. S. Truncik, S. Uchaikin, J. Wang, B. Wilson, G. Rose. Quantum annealing with manufactured spins. Nature, 473(7346), 194-198, 2011.

P. Hailes, L. Xu, R. G. Maunder, B. M. Al-Hashimi, L. Hanzo. A survey of FPGA-based LDPC decoders. IEEE Communications Surveys & Tutorials, 18(2), 1098-1122, 2016.

P. J. Van Laarhoven, E. H. Aarts. Simulated annealing. Simulated annealing: Theory and applications, 7-15. Springer, 1987.

R. Gallager. Low-density parity-check codes. IRE Transactions on Information Theory, 8(1), 21-28, 1963.

R. Kastner, J. Matai, S. Neuendorffer. Parallel programming for fpgas. arXiv preprint arXiv:1805.03648, 2018.

R. Tanner. A recursive approach to low complexity codes. IEEE Transactions on information theory, 27(5), 533-547, 1981.

R. Yazdani, M. Ardakani. Efficient llr calculation for non-binary modulations over fading channels. IEEE transactions on communications, 59(5), 1236-1241, 2010.

S. Boixo, T. F. Rønnow, S. V. Isakov, Z. Wang, D. Wecker, D. A. Lidar, J. M. Martinis, M. Troyer. Quantum annealing with more than one hundred qubits. arXiv preprint arXiv:1304.4595, 2013.

S. K. Chilappagari, D. V. Nguyen, B. Vasic, M. W. Marcellin. Girth of the tanner graph and error correction capability of ldpc codes. Communication, Control, and Computing, 2008 46th Annual Allerton Conference on, 1238-1245. IEEE, 2008.

T. Kadowaki, H. Nishimori. Quantum annealing in the transverse Ising model. Phys. Rev., E(58), 5355-5363, 1998.

(56) References Cited

OTHER PUBLICATIONS

Technical Description of the D-Wave Quantum Processing Unit, D-Wave Systems Documentation, Website, May 5, 2021.
UltraScale Architecture Configurable Logic Block User Guide. Xilinx Inc. Feb. 28, 2017, 58 pages.
V. V. Zyablov, M. S. Pinsker. Estimation of the error-correction complexity for Gallager low-density codes. Problemy Peredachi Informatsii, 11(1), 23-36, 1975; English abstract.
Vivado Design Suite User Guide. Xilinx Inc. Oct. 13, 2014, 21 pages.
Written Opinion of the International Searching Authority dated Jul. 29, 2020, in International Application No. PCT/US2020/032380.
Y. Lin, L. Shao, Z. Zhu, Q. Wang, R. K. Sabhikhi. Wireless network cloud: Architecture and system requirements. IBM Journal of Research and Development, 54(1), 2010.
Y. Sun, M. Karkooti, J. R. Cavallaro. High throughput, parallel, scalable LDPC encoder/decoder architecture for OFDM systems. IEEE Dallas Circuits and Systems Workshop on Design, Applications, Integration and Software, 39-42, 2006.
Z. Bian, F. Chudak, R. Israel, B. Lackey, W. G. Macready, A. Roy. Discrete optimization using quantum annealing on sparse ising models. Frontiers in Physics, 2, 56, 2014.
Z. Bian, F. Chudak, W. G. Macready, G. Rose. The Ising model: teaching an old problem new tricks. D-Wave systems, 2, 2010.

\* cited by examiner

QUANTUM BELIEF PROPAGATION FOR LOW DENSITY PARITY CHECKS

CROSS REFERENCE TO RELATED APPLICATIONS

This patent application is a national stage application of International Application No. PCT/US2020/032380, filed May 11, 2020, which claims priority to, and thus the benefit of an earlier filing date from, U.S. Provisional Patent Application No. 62/845,377 (filed May 9, 2019), the contents of each of which are hereby incorporated by reference.

STATEMENT REGARDING FEDERALLY SPONSORED RESEARCH OR DEVELOPMENT

This invention was made with government support under Grant No. CNS-1824357 awarded by the National Science Foundation. The government has certain rights in the invention.

BACKGROUND

Data transmission exists in a variety of forms over a variety of channel types. For example, data may be communicated over a Radio Frequency (RF) channel from a transmitter to a receiver, such as that occurring in mobile communications (e.g., cell phones), satellite communications, line of sight communications, and the like. A channel may even include data transfers in storage devices and systems. For example, in a hard disk drive (HDD), the channel may include the transfer of data between the read/write head and a magnetic disk. Or, the channel may include the transfer of data to and from memory cells of a flash memory device. The channel may even include computer buses that transfer data between electronic components, and optical fibers that transfer data between optoelectronic components.

In whatever form, these channels are rarely ideal communication links as noise may exist in, or be introduced to, the channels. And, the noise can impart errors on the data being transmitted (e.g., by flipping and/or degrading bits in the data transmission). To correct the errors, error correction codes (ECC) are often configured with the data being transferred such that the intended data may be reconstructed at a receiving end of the transmission. For example, a transmitter may encode a message with an ECC that allows the receiver to detect and correct some number of errors in the message without retransmission of the message.

Some forms of error correction include redundant bits of data that provide simple parity checks. Other forms of error correction, such as Low Density Parity Checks (LDPC), are much more complex and are used to encode and decode relatively large blocks of data. Processing requirements, however, generally increase with the complexity and size of the ECC.

SUMMARY

Systems and methods presented herein provide for error correction via LDPC coding. In one embodiment, a system includes a data buffer operable to receive a block of LDPC encoded data. The system also includes a processor operable to reduce a belief propagation algorithm used to encode the LDPC encoded data into a quadratic polynomial, to embed the quadratic polynomial onto a plurality of quantum bits (qubits), and to decode the block of LDPC encoded data via the qubits.

The various embodiments disclosed herein may be implemented in a variety of ways as a matter of design choice. For example, some embodiments herein are implemented in hardware whereas other embodiments may include processes that are operable to implement and/or operate the hardware. Other exemplary embodiments, including software and firmware, are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments. It will thus be appreciated that those skilled in the art will be able to devise various arrangements that, although not explicitly described or shown herein, embody certain principles and are included within the scope of the embodiments. Furthermore, any examples described herein are intended to aid in understanding the embodiments and are to be construed as being without limitation to such specifically recited examples and conditions. As a result, the embodiments are not limited to any of the examples described below.

Figure 1:
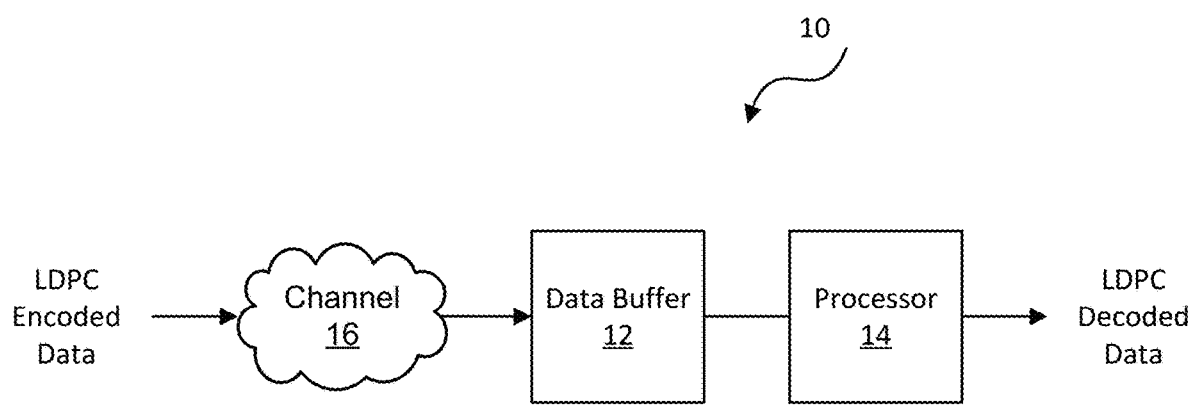
FIG. 1 is a block diagram of an exemplary system for decoding LDPC encoded data.

FIG. 1 is a block diagram of an exemplary error correction system 10. In this embodiment, the error correction system 10 includes a data buffer 12 and a processor 14. The data buffer 12 is operable to receive and at least temporarily store data. The data, in this embodiment, is encoded in "blocks" (e.g., an established number of bits or bytes) with an LDPC ECC. For example, the data may be transmitted over a noisy channel 16 that may introduce errors in the data (e.g., flipped bits, degraded bits, etc.). To counter the errors, the transmitter side of the communication link may encode the data with an LDPC error correction code (ECC) in predetermined block sizes.

Using iterative belief propagation techniques of the LDPC ECC, the receiver side of the channel 16 may correct the errors in the data. In this regard, the data buffer 12 may receive the LDPC encoded data such that the processor 14 may decode the data. In doing so, the processor 14 may be operable to reduce the belief propagation algorithm of the LDPC ECC into a quadratic polynomial. The processor 14 may embed the quadratic polynomial onto a plurality of quantum bits (qubits) and then decode the block of LDPC encoded data via the qubits.

Based on the foregoing, the processor 14 is any device, system, software, firmware, or combination thereof operable to decode LDPC encoded data using qubits. In some embodiments, the processor 14 includes a quantum annealer that uses a metaheuristic for finding a global minimum of an objective function over a given set of candidate solutions/states via quantum fluctuations (e.g., temporary changes in the amount of energy in a point in space).

The data buffer 12 is any device, system, software, firmware, or combination thereof operable to at least temporarily store data. Examples of the data buffer 12 include various types of storage devices such as NAND flash memory devices, magnetoresistive memory devices, magnetic disk drives (e.g., hard disk drives), Random Access memory devices (RAMs, such as DRAMs), various combinations thereof, and the like.

The channel 16 includes any device or means for conveying data from a transmitter to a receiver. For example, in one embodiment, the channel 16 may provide over-the-air RF communications (e.g., satellite communications, cellular telephony, line of sight communications, etc.). In other embodiments, the channel 16 may include optical fiber used to convey optical data, various electronics and/or buses that are operable to convey data between electronic devices, storage device components and systems (e.g., magnetic read/write heads in hard disk drives, read/write controllers of NAND flash memory devices, cloud storage systems, etc.), and the like.

As mentioned, LDPC ECCs use belief propagation techniques to encode and decode blocks of data. Belief propagation algorithms in LDPC pass messages back and forth between check nodes and bit nodes described by a Tanner graph, eventually propagating information about checks and received bits in an LDPC codeword around the entire graph. While LDPC codes enjoy an inherently parallel structure, LDPC decoders generally require several serial message passing iterations to converge on a final result, thus limiting the communication throughput that silicon-based hardware LDPC decoders can achieve. Additionally, the silicon-based LDPC decoders limit the amount of computation they undertake in order to maintain an exceptional decoding latency and communication throughput. Accordingly, silicon-based LDPC decoders suffer from bit errors arising from computations in addition to those imparted by noise in communication channels.

To address these issues, the processor 14 may comprise a quantum annealer. A quantum annealer is a specialized analog computer that can solve non-deterministic polynomial (NP) complete and NP hard optimization problems in their equivalent Ising specifications. Quantum annealers generally include an array of physical devices each representing a single physical qubit that can take on a continuum of values unlike classical information bits, which are binary. A set of desired pairwise constraints between individual qubits (e.g., a preference that two particular qubits should differ and/or that two particular qubits should be identical) are input to the quantum annealer such that preferences regarding each individual qubit can take on a particular binary value in the solution output. The quantum annealer considers the entire set of constraints as a large optimization problem that is typically expressed as a quadratic polynomial of binary variables. A number of quantum annealing trials typically includes a single run with each anneal trial resulting in a potentially different solution to the problem (e.g., a set of classical output bits, one per qubit that fits the constraints of the trial).

Quantum annealers may be operable to implement the belief propagation algorithms of LDPC decoders. For example, the quantum annealer (e.g., the processor 14) may reduce the construction of an LDPC code directly onto a physical grid of qubits in the quantum annealer, taking into account the practical, real-world physical interconnections between individual qubits.

This reduction bypasses quadratic polynomial representation and allows for the quantum annealer to be tailored to a physical layout and connectivity of the qubits. In doing so, the quantum annealer includes an embedding scheme that can leverage much, if not all, of the available quantum annealing hardware qubit resources. In one embodiment, the quantum annealer includes a D-Wave 2000 qubit quantum adiabatic optimizer machine provided by D-Wave Systems Inc. In this embodiment, the embedding scheme may be operable to realize up to 700 problem variables or logical qubits representing up to 420 LDPC bit nodes. However, the embodiments herein are not intended to be limited to any type of quantum computing or any quantum computer size.

Before discussing exemplary implementations of LDPC decoding via qubits, a brief discussion on LDPC codes is provided. A binary (N, K) LDPC code is generally a linear block code described functionally by a sparse parity check matrix. The LDPC code is said to be a $(d_b, d_c)$ regular code if every bit node participates in $d_c$ checks and every check has $d_b$ bits that together constitute a check constraint. With conventional encoding and decoding schemes of LDPC codes, let H=[hij]M×N be the LDPC parity check matrix. Each row in H represents a check node constraint whereas each column indicates which check constraint a bit node participates in.

Figure 2:
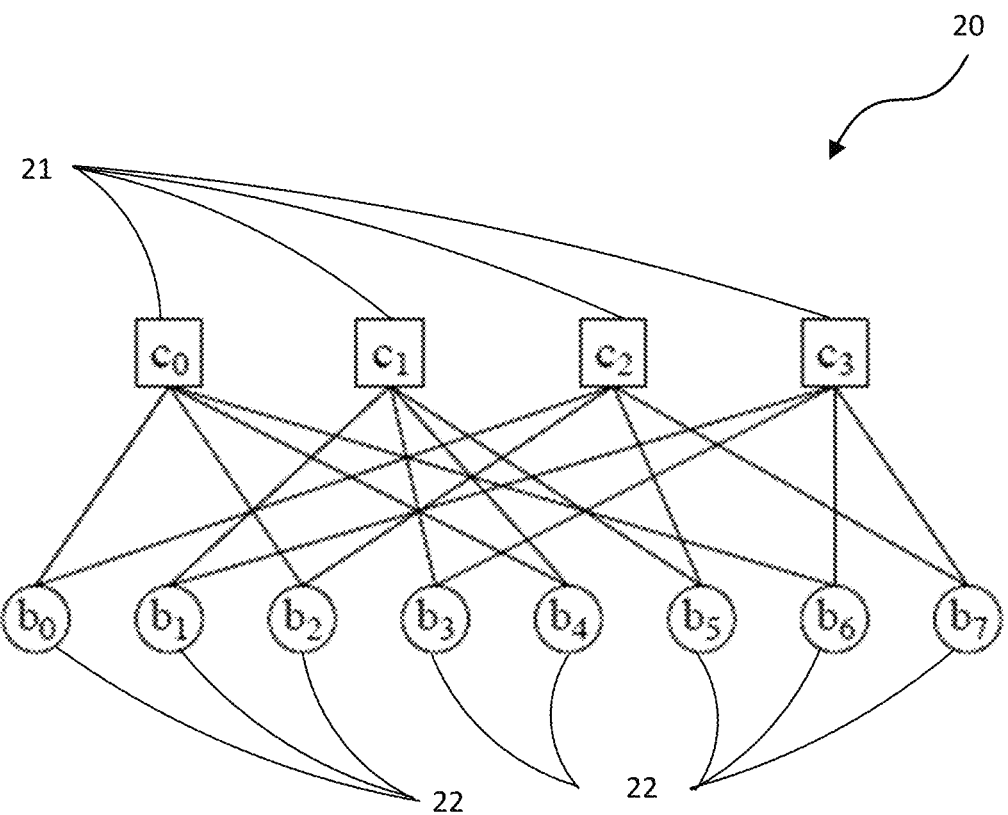
FIG. 2 is a block diagram of an exemplary Tanner graph.

Now, turning to FIG. 2, a Tanner graph 20 illustrates nodes 21 and 22. The nodes 21 labeled $c_i$ are "check nodes" and the nodes 22 labeled $b_i$ are "bit nodes". The value of "1" at $h_{mn} \in H$ represents an edge between $c_m$ and $b_n$. Code "girth" (e.g., the length of the shorter cycle in the Tanner graph 20) is an important measure as a low girth affects the independence of information exchange between the check and bit nodes and diminishes the LDPC code performance.

For encoding, let u be a message of length K. The overall encoding process may be summarized by first converting H into an automated form of $[P|I_{N-K}]$ by Gauss-Jordan elimination (e.g., where P is obtained in the conversion process and I is the identity matrix). Then, a generator matrix G is constructed as $[I_K|P^T]$. In the encoded message c may be constructed as c=uG. This encoding generally ensures that the modulo two bit sum at every check node is zero.

For decoding, the belief propagation based "min-sum" algorithm is used. For example, let y be the received information, let $N(c_m)$ be the set of bit nodes participating in the check restraint $c_m$, and let $M(b_n)$ be the set of check nodes connected to the bit node $b_n$. Then, initialize all of the bit nodes with their respective a priori likelihood ratio (LLR) as:

$$LLR_{b_n}(x_n) = \log\left(\frac{Pr(b_n = 0|y)}{Pr(b_n = 1|y)}\right) \forall\, b_n \in N(c_m) \quad \text{Eq. 1.}$$

Then, for every combination of $\{(m, n)|h_{mn}=1\}$, initialize messages sent to the check node $c_m$ from the bit node $b_n \in N(c_m)$ as:

$$Z_{b_n \to c_m}(x_n) = LLR_{b_n}(x_n) \quad \text{Eq. 2.}$$

Then, every check node $c_m$ updates the message to be sent back with respect to every $b_n \in N(c_m)$ as:

$$Z_{c_m \to b_n}(x_n) = \prod_{b_{n'} \in N(c_m) \setminus b_n} \text{sign}(Z_{b_{n'} \to c_m}) \min_{b_{n'} \in N(c_m) \setminus b_n} |Z_{b_{n'} \to c_m}| \quad \text{Eq. 3.}$$

Each bit node may now update the message to send back in accordance with the receipt check messages and its own belief by computing:

$$Z_{b_n \to c_m}(x_n) = LLR_{b_n}(x_n) + \sum_{c_{m'} \in M(b_n) \setminus c_m} Z_{c_{m'} \to b_n}(x_n) \quad \text{Eq. 4.}$$

Then, to decode the encoded data, each bit node computes:

$$Z_{b_n}(x_n) = LLR_{b_n}(x_n) + \sum_{c_m \in M(b_n)} Z_{c_m \to b_n}(x_n) \quad \text{Eq. 5}$$

After decoding, a decision step includes quantizing $\hat{x}=[\hat{x}_0, \hat{x}_1, \ldots, \hat{x}_{N-1}]$ such that $\hat{x}_n=0$ if $Z_{b_n}(x_n) \geq 0$, else $\hat{x}_n=1$, with $\hat{x}$ being the decoded bits. If $\hat{x}$ satisfies a condition enforced at encoding $\hat{x}H^T=0$, then $\hat{x}$ is declared as the final decoded message. If $\hat{x}$ does not satisfy this condition, the belief propagation algorithm iterates each of the steps until a satisfactory $\hat{x}$ is obtained. The decoder may then terminate at a predetermined threshold number of iterations.

Before discussing how to implement the decoding on the quantum annealer, a brief introduction to quantum annealing is presented. Quantum annealing is a heuristic approach designed to solve combinatorial optimization problems and can be understood at a high level as solving the same class of problems as simulated annealing techniques. The quantum annealer (e.g., the processor 14) takes advantage of a fundamental fact that any process in nature seeks a minimum energy state to attain stability. Given a discrete optimization problem is as an input, a quantum annealer of the processor 14 internally frames the optimization problem as an energy minimization problem and outputs its ground state as the solution.

Qubits are generally classified into two types—physical and logical. A physical qubit is one that is directly and physically available on the quantum annealing hardware, whereas a logical qubit is a set of physical qubits. Often, the quantum annealing hardware lacks a coupler between a particular pair of physical qubits that a user would like to correlate. To construct this relationship, intermediate couplers may be used to make several physical qubits behave similarly, which may be referred to herein as "embedding".

The set of similarly behaving embedded physical qubits may then be referred to as a logical qubit. The process of evolution of quantum bits to settle down at a ground state in the quantum annealer (e.g., the processor 14) is called an "anneal" whereas the time taken for this evolution is called an "annealing time". The strength of the preference is given to each single qubit to end up in a particular logical "0" or a particular logical "1" state is referred to as a "bias", whereas the strength of each coupler is referred to as a "coupler strength". The strength of the couplers that are used to make physical qubits behave similarly in the embedding process are generally referred to as "JFerros".

The quantum annealer of the processor 14 comprises a network of interlaced radio frequency superconducting quantum interference device flux qubits fabricated as an integrated circuit where the local longitudinal fields (i.e., the biases) of the qubits are adjustable with an external magnetic field. Interactions (i.e., the couplers) between pairs of qubits may be realized with a tunable magnetic coupling using programmable "on-chip" control circuitry. In one embodiment, the interconnection comprises a quasi-planar bi-layer Chimera graph, such as that illustrated in FIG. 3.

Figure 3:
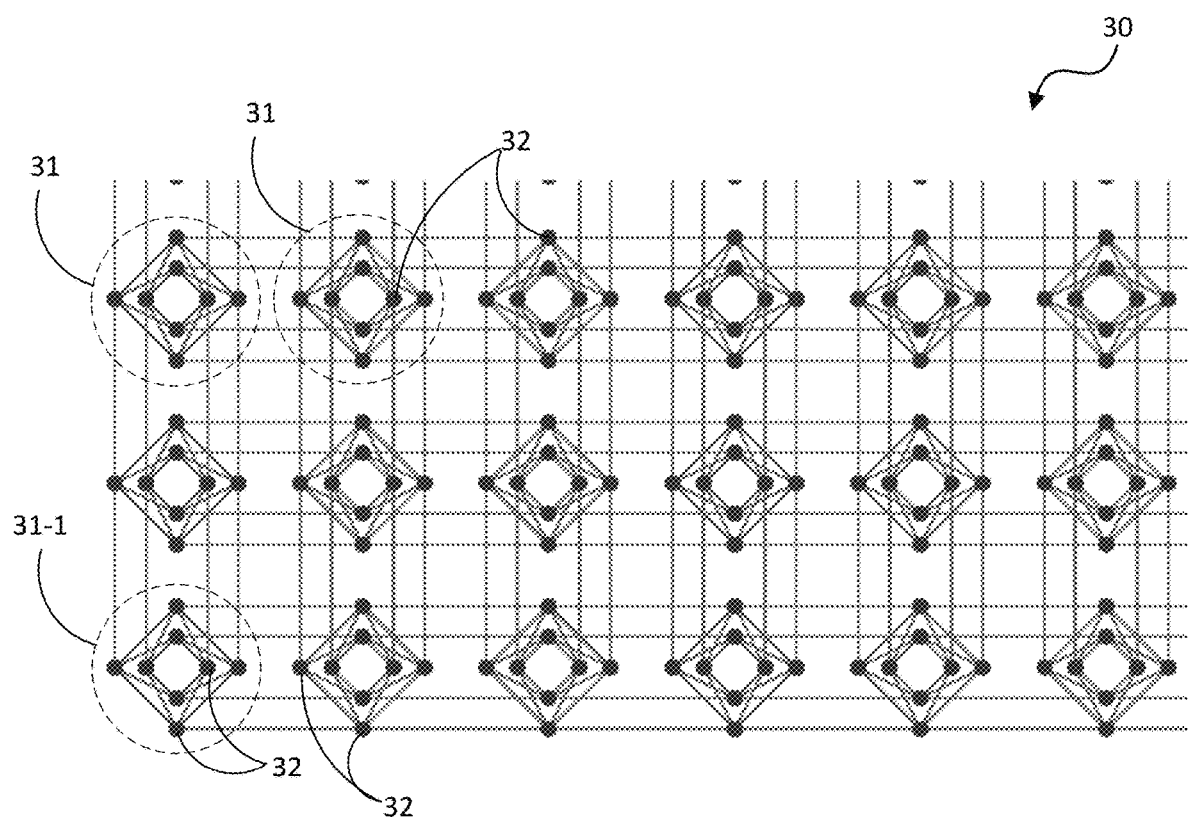
FIG. 3 is an exemplary Chimera graph.

FIG. 3 illustrates a 3×6 portion of a 16×16 an exemplary Chimera graph 30. The Chimera graph 30 comprises a plurality of Chimera unit cells 31 with each cell 31 comprising a set eight of physical qubits. Each edge in the Chimera graph 30 is a coupler.

The quantum annealer of the processor 14 may be operable to simulate systems in a two-dimensional transverse field Ising model described by the time-dependent Hamiltonian equation of:

$$H(s) = -A(s)\sum_i \sigma_i^x + B(s)H_P \quad \text{Eq. 6}$$

and $$H_P = \sum_i h_i \sigma_i^z + \sum_{i<j} J_{ij} \sigma_i^z \sigma_j^z \quad \text{Eq. 7}$$

where $\sigma_i^{x,z}$ are the Pauli matrices acting on the $i^{th}$ qubit, $h_i$ and $J_{ij}$ are the problem parameters, $s=t/t_a$ (where t is time and $t_a$ is the annealing time). A(s) and B(s) are two monotonic signals such that, at the beginning of the anneal (i.e., t=0), $A(0) \gg B(0) \approx 0$. And, at the end of the anneal (i.e., $t=t_a$), $B(1) \gg A(1) \approx 1$. The processor 14 initializes the qubits in a superposition state $$\frac{1}{\sqrt{2}}(|0\rangle + |1\rangle)$$

that has no classical counterpart. The processor 14 may then gradually evolve this Hamiltonian from t=0 until $t=t_a$ by introducing quantum fluctuations in a low temperature environment. The time-dependent evolution of the signals A and B is generally the annealing algorithm. During the annealing process, the processor 14 may ideally stay in a local minima and probabilistically find a global minimum energy configuration of the problem Hamiltonian $H_p$ at a conclusion.

The quantum annealer of the processor 14 may be used to solve a class of quadratic unconstrained binary optimization (QUBO) problems in an equivalent Ising specification, which may be defined as a generalized Ising/QUBO as:

$$E = \sum_i h_i q_i + \sum_{i<j} J_{ij} q_i q_j \quad \text{Eq. 8.}$$

Ising form solution variables $\{q_i\}$ may take values in $\{-1, 1\}$, whereas in the QUBO form they may take values in $\{0,1\}$. The linear coefficient $h_i$ is the bias of $q_i$ and the quadratic coefficient $J_{ij}$ is the strength of the coupler between $q_i$ and $q_j$. Coupler strength may be used to make the qubits agree or disagree. For example, consider the exemplary Ising problem:

$$E = J_{12} q_1 q_2, (q_1 q_2 \in \{-1,+1\}) \quad \text{Eq. 9.}$$

In a first scenario, $J_{12}=+1$. The energies for qubit states $(q_1, q_2)=(-1,-1), (-1,+1), (+1,-1)$, and $(+1,+1)$ are $+1, -1, -1$, and $+1$, respectively. Accordingly, a strong positive coupler strength implies that a minimum energy of $-1$ is obtained when two qubits are opposites of each other.

In another scenario, $J_{12}=-1$. The energies for qubit states $(q_1, q_2)=(-1,-1), (-1,+1), (+1,-1)$, and $(+1,+1)$ are $-1, +1, +1$, and $-1$, respectively. Accordingly, a strong negative coupler strength implies that a minimum energy of $-1$ is obtained when two qubits agree with each other.

Now, visualizing the relationship between logical and physical qubits, another exemplary problem may be considered as follows:

$$E = J_{12} q_1 q_2 + J_{23} q_2 q_3 + J_{13} q_1 q_3 \quad \text{Eq. 10.}$$

Figure 4:
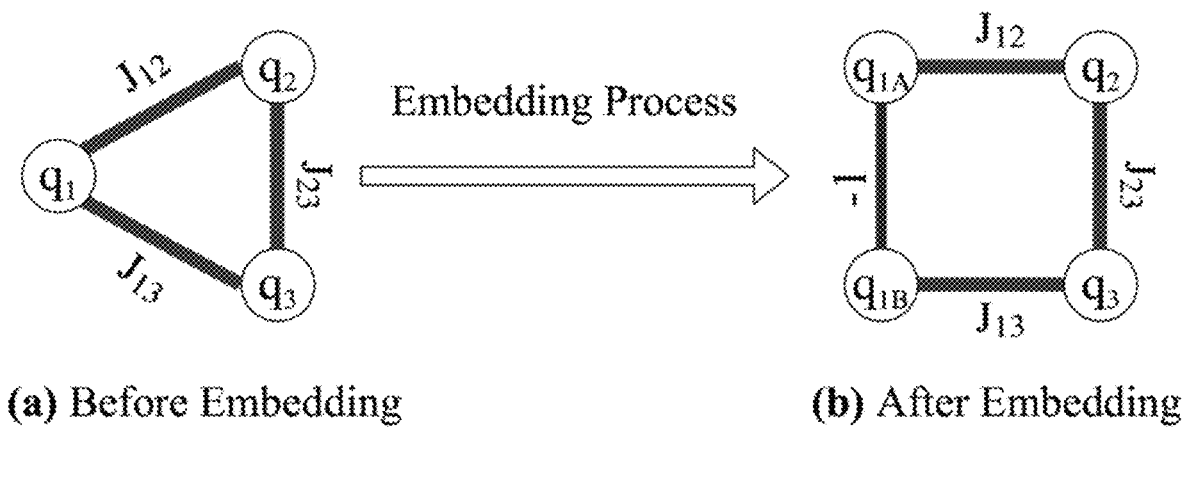
FIG. 4 illustrates an exemplary process for embedding logical qubits onto to physical qubits.

FIG. 4 illustrates the embedding process of Eq. 10. The logical qubit $q_1$ before embedding is mapped onto two physical qubits $q_{1A}$ and $q_{1B}$ after embedding with a JFerro of $-1$. Here, $q_{1A}$ and $q_{1B}$ agree with each other.

It should be noted that a three node fully connected graph structure does not exist in a Chimera graph (e.g., Chimera graph 30 of FIG. 3). Accordingly, one solution may include embedding one of the logical qubits into a physical realization consisting of two physical qubits as illustrated after embedding. This may allow for the construction of each edge (e.g., $J_{12}$, $J_{23}$, and $J_{13}$), e.g., as illustrated before embedding. In this embodiment, the logical qubit $q_1$ is mapped to physical qubits $q_{1A}$ and $q_{1B}$ with a JFerro of $-1$ to make $q_{1A}$ and $q_{1B}$ agree with each other.

With this in mind, the belief propagation algorithm of the LDPC code may be implemented as an LDPC decoding problem embedded on the quantum annealer (e.g., processor 14). First, the LDPC decoding problem may be reduced to a QUBO form. In this embodiment, the QUBO reduction of the LDPC decoding problem is a linear combination of two functions—an LDPC satisfier function and an LDPC distance function.

During an anneal, the LDPC satisfier function leaves valid LDPC codewords in a zero energy level while raising the energy of invalid codewords by a magnitude proportional to the LDPC code girth. The distance function distinguishes a true solution of the LDPC decoding problem among valid LDPC codewords by separating them by a magnitude depending on a distance between the individual codeword and the received information (e.g., including channel noise).

To generate a system model, let $y=[y_0, y_1, \ldots, y_{N-1}]$ be the received information corresponding to an LDPC encoded transmitted message of $x=[x_0, x_1, \ldots, x_{N-1}]$. Then, let V be the set of check constraints $c_i$ of the LDPC encoding. Additionally, let the final decoded message be the final states of the qubits $[g_0, g_1, \ldots, g_{N-1}]$, respectively, and let any $q_{e_i} \forall i>0$ be an ancillary qubit used for calculation purposes. Any given binary string may then be said to have a valid codeword when the binary string checks against a given parity check matrix. Otherwise, the codeword is invalid.

As mentioned, the QUBO objective function of the belief propagation algorithm may include two terms—the LDPC satisfier function and the LDPC distance function. The LDPC satisfier function may be represented as $$\sum_{\forall c_i \in V} L_{sat}(c_i).$$

This function may be used to prioritize solutions that satisfy the LDPC check constraints (e.g., $L_{sat}(c_i)=0$). The LDPC's distance function may be represented as $\sum_{j=0}^{N-1} \Delta_j$ and may be used to calculate a candidate solution's proximity to received information. The entire QUBO function may thus be represented as a weighted linear combination of the two terms (i.e., the satisfier function and the distance function) as follows:

$$\min_{q_i} \left\{ W_1 \sum_{\forall c_i \in V} L_{sat}(c_i) + W_2 \sum_{j=0}^{N-1} \Delta_j \right\} \quad \text{Eq. 11.}$$

In Eq. 11, $W_1$ is a positive weight used to enforce LDPC satisfying constraints while the positive weight $W_2$ may increase the success probability of finding a ground truth.

Figure 5:
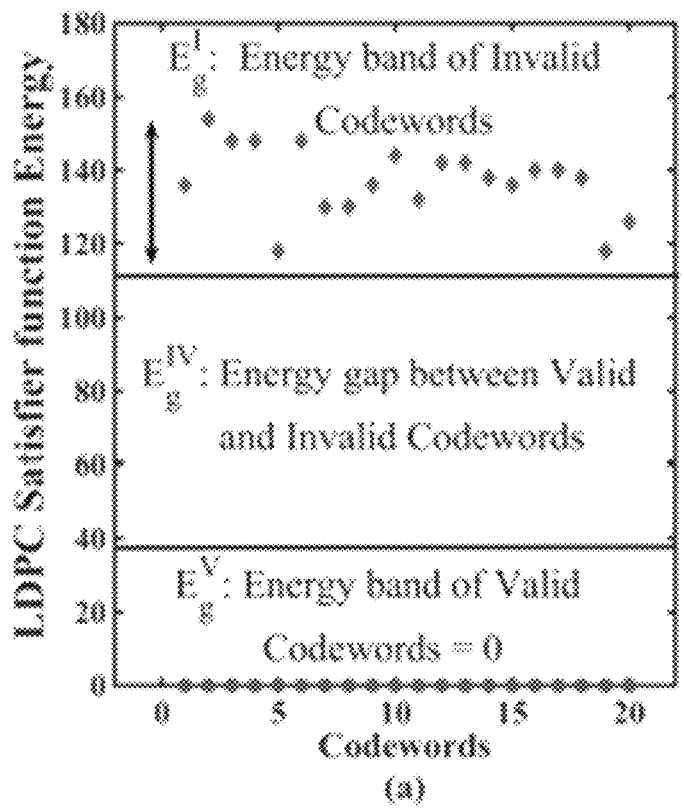
FIG. 5 illustrates an LDPC satisfier function creating an exemplary energy gap between valid and invalid codewords.
Figure 6:
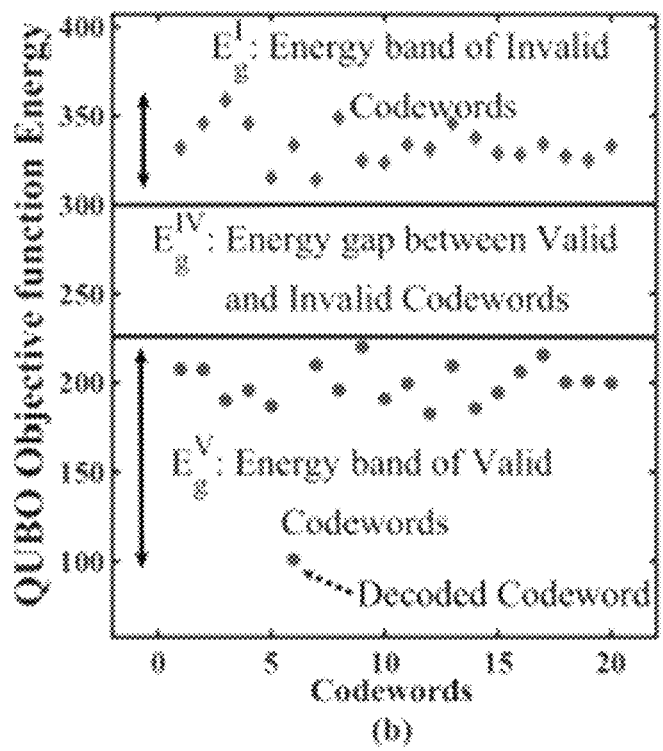
FIG. 6 illustrates an objective function of the belief propagation algorithm exemplarily separating energy bands of both valid and invalid LDPC codewords.

Exemplary energies of the LDPC satisfier function and the objective function of the belief propagation are illustrated in FIGS. 5 and 6. For example, FIG. 5 illustrates the LDPC satisfier function creating an energy gap between valid and invalid codewords. FIG. 6 illustrates the objective function of the belief propagation algorithm separating energy bands of both the valid and invalid LDPC codewords to correctly decode. In this example, actual data was used to compute the energy values of 20 valid codewords and 20 invalid codewords drawn at random. The LDPC satisfier function creates an energy gap of magnitude $E_g^{IV}$ between valid and invalid codewords. This energy gap $E_g^{IV}$ may be directly proportional to the girth of the LDPC code. For example, if the girth of the code is low, there exists an invalid codeword with a low Hamming distance to a valid codeword, thus implying a relatively low energy gap $E_g^{IV}$.

Figure 7:
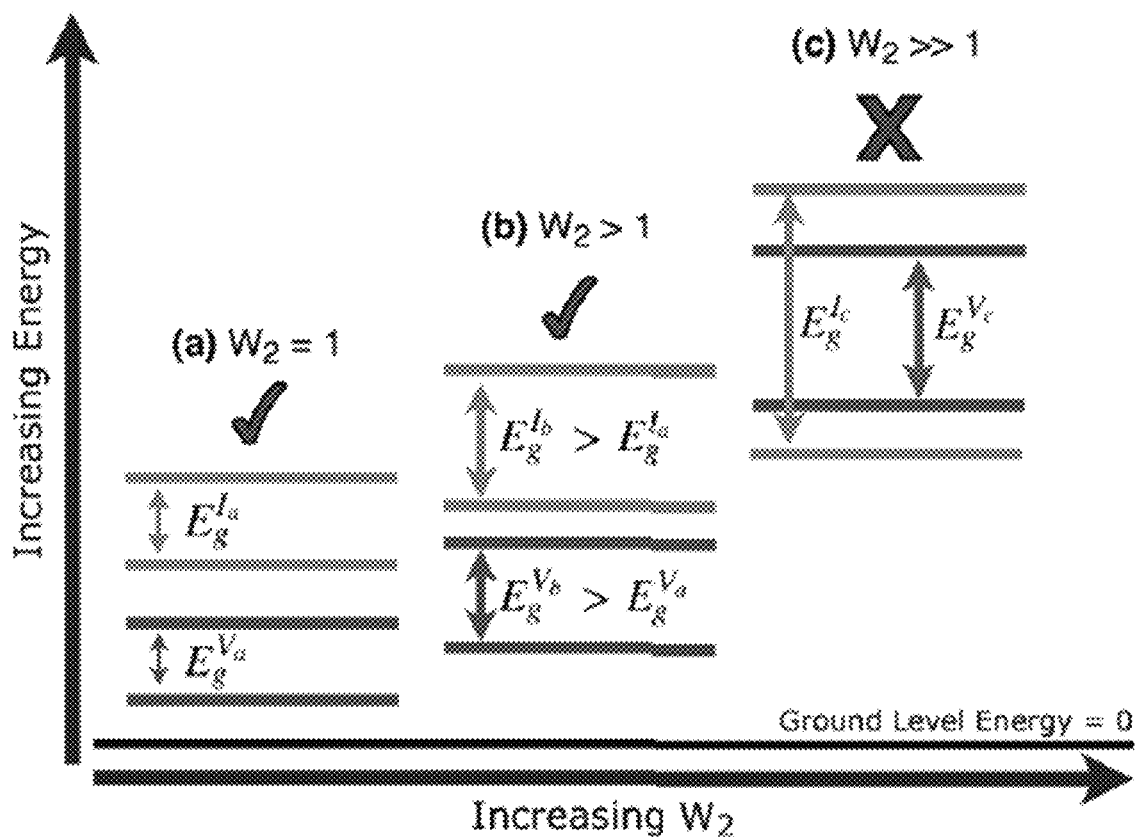
FIG. 7 illustrates exemplary energy levels via the selection of an objective function parameter.

By increasing $W_1$, the energy gap increases and eliminates invalid codewords as potential solutions. The LDPC distance function distinguishes a transmitted codeword from other valid (but not transmitted) codewords that would otherwise reside in the ground energy state. The distance function separates the energy levels of both valid (e.g., $E_g^V$) and invalid (e.g., $E_g^1$) codewords by a factor proportional to the design parameter $W_2$. $W_1$ and $W_2$ may be experimentally determined based on the impact of a channel's signal-to-noise ratio (SNR) and the dynamic range of the quantum annealer of the processor 14. For example, FIG. 7 illustrates exemplary energy levels via the selection of the objective function parameter $W_2$. Valid and invalid codeword bands are separated but the full dynamic range of the quantum annealer may not be fully utilized. By selecting $W_2>1$, the quantum annealer achieves the desired separation and full dynamic range, while $W_2 \gg 1$ fails to achieve separation.

The constraint on LDPC encoding is that a modulo two bit sum at every check node is zero (i.e., the sum is even). For each check node the LDPC satisfier function may be represented as:

$$L_{sat}(c_i) = ((\Sigma_{\forall j: h_{ij}=1} q_j) - 2L_e(c_i))^2 \forall c_i \in V \qquad \text{Eq. 12}$$

The LDPC constraint is satisfied at the check node $c_i$ when $L_{sat}(c_i)=0$. $L_e(c_i)$ is a function of ancillary qubits $\{q_{e_i}\}$. $L_e$ may be formulated to use a minimal number of ancillary qubits via the following minimization:

$$L_e(c_i) = \sum_{s=1}^{t} (2^{s-1} \cdot q_{e_{s+k}}) \qquad \text{Eq. 13.}$$

$$t = \min_{n \in \mathbb{Z}} \{2^{n+1} - 2 \geq d(c_i) - (d(c_i) \bmod 2)\}, \qquad \text{Eq. 14.}$$

where $d(c_i)$ is the degree of $c_i$ (i.e., the number bits in the check constraint $c_i$). The value of k in $L_e(c_i)$ is generally the largest index of the ancillary qubit used while computing $L_e(c_{i-1})$, thus ensuring each ancillary qubit is only used once. The formulation of $L_e$ can generally take all possible integral values in the range of $[0, 2^t-1]$ (i.e., each energy for a distinct combination of ancillary qubits in that $L_e$). Since each configuration of ancillary variables takes a distinct integer, the formulation of $L_e$ may be optimal in terms of using less ancillary qubits. Substitution of $L_e(c_i)$ in Eq. 12 may lead to an $L_{sat}(c_i)$ being zero when the most possible even sum of bits in $c_i$ (i.e., $d(c_i)-(d(c_i) \bmod 2))$ does not exceed $2(2^t-1)$, leading to the generalized minimization condition of Eq. 14. The number of ancillary qubits needed per check node is as follows:

| Check node degree $d(c_i)$ | 3 | 4-7 | 8-15 | 16-31 |
|---|---|---|---|---|
| Ancillary qubits needed | 1 | 2 | 3 | 4 |

Upon expansion of Eq. 12, $L_{sat}(c_i)$ introduces both biases and couplers to the objective QUBO and is therefore embedded onto the Chimera graph (e.g., Chimera graph 30 of FIG. 3).

For the distance function, a distance $\Delta_i$ is defined that computes the proximity of the $i^{th}$ qubit $q_i$ to its respective received information $y_i$ as:

$$\Delta_i = (q_i - Pr(q_i=1|y_i))^2 \qquad \text{Eq. 15.}$$

The probability that $q_i$ should take a "1" value given the received soft information $y_i$ can be computed using the likelihood information obtained from the soft de-mapping of received symbols for various modulations and channels. For example, in a bi-phase shift keyed (BPSK) signal ($0 \rightarrow -1$, $1 \rightarrow +1$), information transmitted over an Additive White Gaussian Noise (AWGN) with a noise variance of $\sigma^2$, the probability may be given as $1/(1+e^{-2y_i/\sigma^2})$. Accordingly, $\Delta_i$ is less for $q_1 \in \{0, 1\}$ and has a greater probability of being the transmitted bit. And, the distance function may only introduce biases to the QUBO problem and does not require embedding due to the absence of coupler terms.

The QUBO reduction of the belief propagation algorithm of the LDPC code may be embedded onto the Chimera graph (i.e., the Chimera graph 30 illustrated in FIG. 3). In one embodiment, the Chimera graph is operable with a D-Wave 2000 qubit quantum adiabatic optimizer machine and the embedding onto the D-Wave 2000 allows for the use of arbitrarily large hardware qubit connectivity that supports LDPC code block links up to 420 bits.

To embed the belief propagation algorithm for the LDPC code onto the quantum annealer, two-dimensional coordinate values U(x,y) are assigned to each unit cell 31 in the Chimera graph 30 of FIG. 3, with the unit cell 31-1 being deemed the origin U(0,0). From there, a unit cell 31 in the Chimera graph 30 takes on the coordinate value U(a,b) and is said to be a neighbor of the unit cell 31 having a coordinate value of U(x,y) when $|x-a|+|y-b|=1$. And, A(x,y) denotes the set of all neighbors of U(x,y). Intra-cell embedding occurs when both participating qubits lie in the same Chimera unit cell 31. And, inter-cell embedding occurs where one of the qubits belongs to U(x,y) and the other participating qubit belongs to a unit cell 31 in A(x,y).

Generally, there are two levels for embedding, Level I and Level II. A graph embedding model first maps the check constraints $L_{sat}(c_i)$ of the LDPC satisfier function by constructing the Level I embedding for the available Chimera unit cell 31 and then accommodates more check constraints via the Level II embedding using the idle qubits that were left out during the Level I embedding. The graph embedding model may make use of the entire qubit computational resources available. For example, in the D-Wave 2000 qubit quantum adiabatic optimizer machine, the graph embedding model may leave no qubit idle in the machine.

Figure 8:
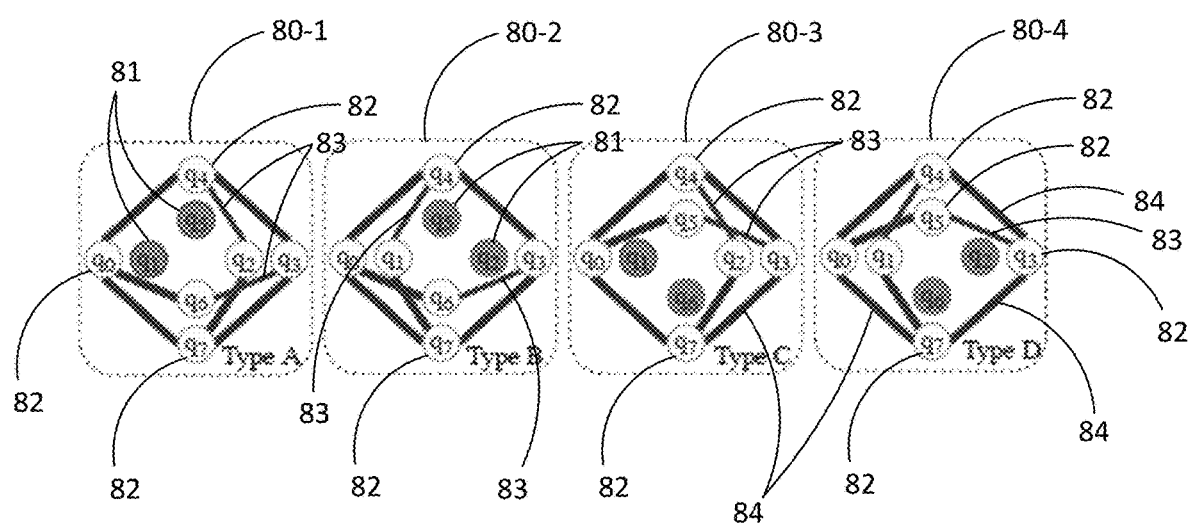
FIG. 8 illustrates four exemplary schemas that a graph embedding model be used to represent a single check constraint on a single Chimera unit cell.

In the Level I embedding, the graph embedding model represents a single check constraint of degree three on a single Chimera unit cell 31 using one of the four schemas 80-1-80-4 illustrated in FIG. 8. Each of these schemas 80 uses six qubits for a degree three check constraint, leaving two qubits in the Chimera unit cell 31 idle (e.g., illustrated by qubits 81). Intra-cell embeddings are illustrated in FIG. 8 via the qubit connections 83 with all other qubit connections 84 being QUBO problem couplers. Based on the coordinate location U(x,y) of the Chimera unit cell 31, the graph embedding model may choose a single schema 80 for a single Chimera unit cell 31 in a manner that creates a specific pattern of I/O qubits in the Chimera graph 30. The graph embedding module may then leverage this pattern to accommodate more check constraints.

The graph embedding model may then place the check constraints that share a common bit closest to each other and embed the qubits representing the shared bit to make them agree. More specifically, if a check constraint $c_i$ is placed in the coordinate value $U(x_0, y_0)$, the graph embedding model may place the check constraints that share common bits with $c_i$ in the neighboring unit cells 31 and embed the qubits representing such commonly shared bits via an inter-cell embedding $\Lambda(x_0, y_0)$.

In the Level II embedding, the graph embedding model represents a single check constraint in an ensemble of nine Chimera unit cells 31 using a pattern of Vital qubits 81 left by the Level I embedding. The placement of each of these ensembles in the Chimera graph 30 may be similar to the Level I embedding in that it places the ensembles whose Level II embedding check constraints share bits that are close to each other.

Now, consider a (2,3) LDPC code where the degree of each check node three. Assume that $[x_a, x_b, x_c]$ are the three bits participating in one of the check constraints $c_i$. Then, let $[q_a, q_b, q_c]$ be the bit node representing qubits used at the decoder to extract $[x_a, x_b, x_c]$, respectively. Thus, from Eqs. 12 and 13, the LDPC satisfying constraint of the check node is $$L_{sat}(C_i) = (q_a + q_b + q_c - 2q_{e_1})^2 \qquad \text{Eq. 16.}$$

Figure 9:
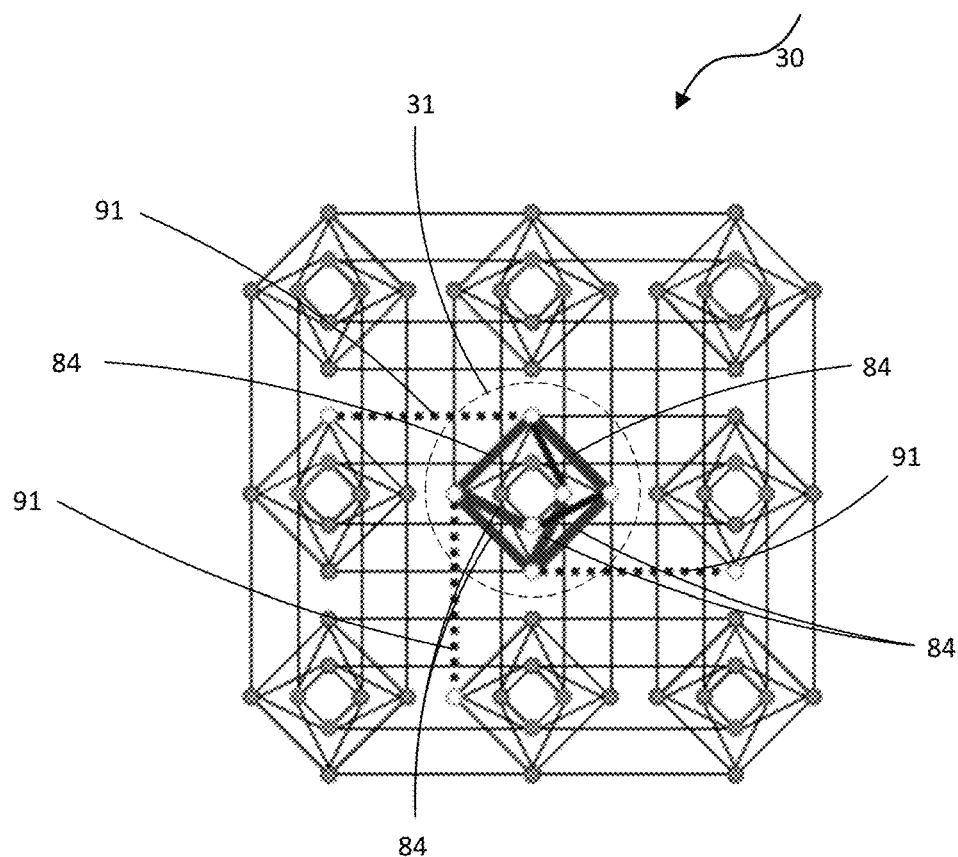
FIGS. 9 and 10 illustrate one of the exemplary schemas of FIG. 8 and an exemplary Level I embedding onto physical qubits
Figure 10:
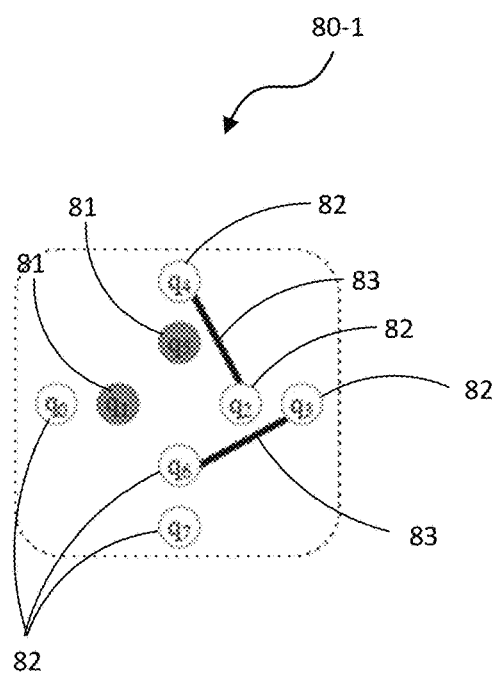

Upon expansion of Eq. 16 and with reference to FIGS. 9 and 10, it can be observed that the quadratic terms (i.e., the qubit pairs) requiring coupler connectivity are $\{(q_a, q_b), (q_a, q_c), (q_a, q_{e_1}), (q_b, q_c), (q_b, q_{e_1}), (q_c, q_{e_1})\}$. The Level I embedding for the example in Eq. 16 can be visualized by interpreting $(q_a, q_b, q_c, q_{e_1})$ as being equivalent to $(q_0, q_4, q_7, q_3)$ of FIG. 10. Quantum belief propagation realizes the above coupler connectivity and the four schemas 80-1–80-4 of FIG. 8.

Now, one exemplary construction of the schema 80-1 can be demonstrated. For example, the required available coupler connectivity can be constructed using the quantum annealer's direct physical couplers of the processor 14 (e.g., $q_0$-$q_4$ in schema 80-1). Then, the required but available coupler connectivity $\{(q_0, q_3), (q_4, q_7)\}$ can be realized using inter-cell embeddings (e.g., $q_2$-$q_4$ in schema 80-1).

Now assume that the graph embedding model chooses the schema 80-1 for one of the Chimera unit cells 31 (see e.g., FIG. 9). Again, the exemplary LDPC code is (2, 3) regular, so every bit node participates in two check constraints. This implies that each "bit-node-representing" qubit, excluding ancillary qubits, is present in two Chimera unit cell 31 because a check constraint $c_i$ in a single Chimera unit cell 31 is represented in the Level I embedding. The graph embedding model thus represents the other check constraint of each of the bit-node-representing qubits $\{q_0, q_4, q_7\}$ in a neighbor unit cell 31 connected via an inter-cell embedding 91 (see e.g., FIG. 9), and makes the physical qubits involved in the embedding agree. The graph embedding model may repeat this construction over the entire Chimera graph 30, mapping each check constraint $c_i$ to an appropriate physical location in the quantum annealer of the processor 14.

Figure 11:
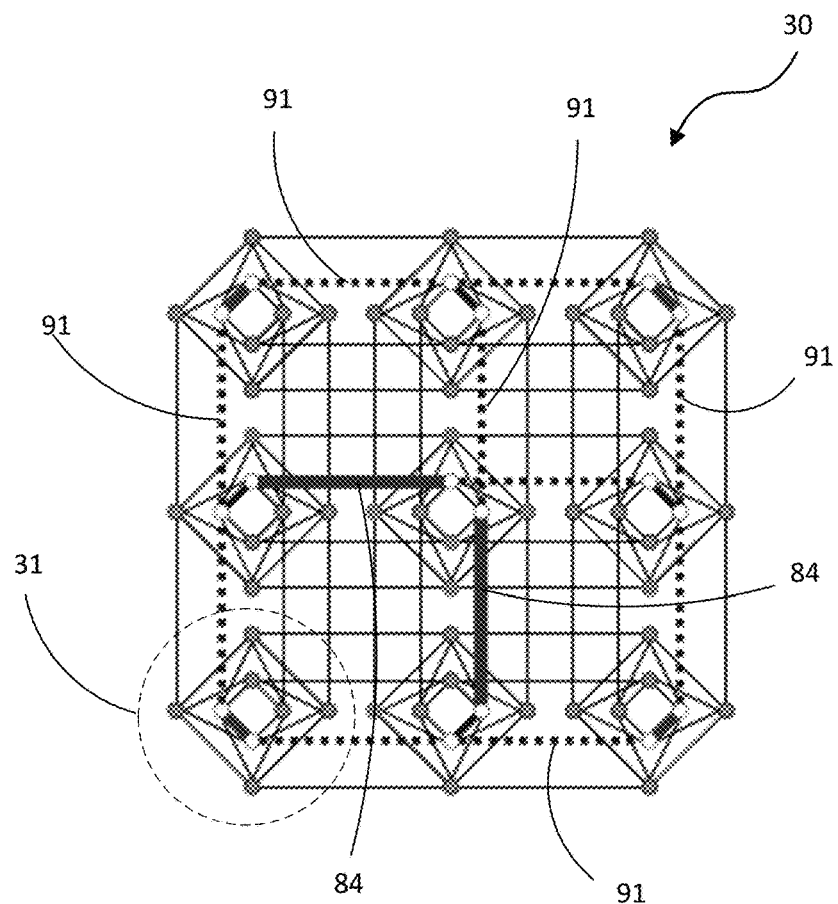
FIGS. 11 and 12 illustrate one exemplary Level II embedding onto physical qubits
Figure 12:
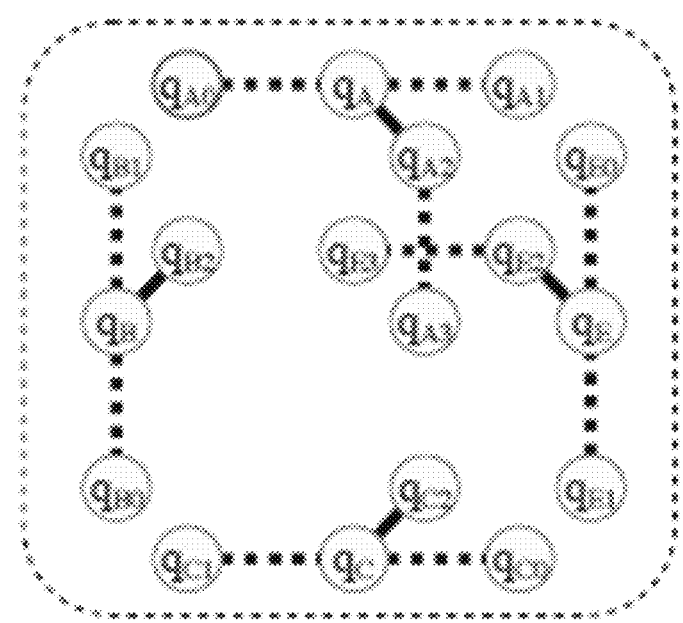

Continuing with the example of Eq. 16, an overview of the level II embedding can be seen in FIGS. 11 and 12. Here, the mapping of bits in the check constraint $c_i$ to physical qubits may be represented as $(q_a, q_b, q_c, q_{e_i})$ And mapped to $(q_A, q_B, q_C, q_E)$ of FIG. 12. For example, in FIG. 12, the qubits $q_{A_i} \in [0,3]$ represent $q_A$, the qubits $g_{B_i} \in [0,2]$ represent $q_B$, the qubits $q_{C_i} \in [0,2]$ represent $q_C$, and the qubits $q_{E_i} \in [0,3]$ represent $q_E$. These qubits are embedded together as illustrated in FIG. 12. Similar to the Level I embedding, the graph embedding model repeats the construction over the entire Chimera graph 30, mapping each Level II check constraint $c_i$ to an appropriate physical location in the quantum annealer of the processor 14.

As mentioned, in one embodiment, the quantum belief propagation algorithm of the LDPC code is embedded on a D-Wave 2000 quantum annealer with the decoder targeting a (2, 3) regular maximum girth LDPC code having a block length of 420 bits. In this embodiment, the LDPC decoding by the processor 14 is evaluated in terms of bit error rate (BER) and frame error rate (FER). In doing so, an instance I may be defined as an LDPC codeword. One exemplary data set comprises 150 instances with an overall $2 \times 10^4$ message bits. The processor 14 conducts $10^4$ anneals for each instance and notes the distribution of the solutions returned along with their occurring frequency. If $N_S^I$ is a number of different solutions returned for an instance I, the solutions are ranked in increasing order of their energies as $R_1, \ldots, R_{N_S^I}$, with $R_1$ being the rank of the minimum energy solution. The $N_S^I$ solutions can then be treated as identically independent random variables as each anneal is identical and independent.

For the BER evaluation, let $R_{min}$ be the rank of the minimum energy solution in a particular population sample of the entire solution distribution of size $N_a$ ($<10^4$) anneals. The expected number of bit errors $N_B^I$ of an instance I over $N_a$ anneals can then be computed as:

$$E[N_B^I | N_a] = \sum_{i=1}^{N_S^I} Pr(R_{min} = R_i | I, N_a) \cdot N_B^I(R_i | I, N_a), \quad \text{Eq. 17.}$$

where the probability of $R_{min}$ being $R_i \forall i \in [1, N_S^I]$ for an instance I over performing $N_a$ anneals may be computed using the cumulative distribution function $F(\bullet)$ of observed solutions in $10^4$ anneals as:

$$Pr(R_{min} = R_i | I, N_a) = (1 - F(R_{i-1}))^{N_a} - (1 - F(R_i))^{N_a}. \quad \text{Eq. 18.}$$

Accordingly, the BER of an instance I with K information bits upon performing $N_a$ anneals can be computed as:

$$BER = E[N_B^I | N_a] / K. \quad \text{Eq. 19.}$$

For the FER, a frame of length $N_F$ is constructed using data blocks of length $N_B$. The processor 14 uses $N_F/N_B$ such blocks, where each block is an instance. If $N_{ins}$ is the number of available instances, the processor 14 can construct a single frame by combining any $N_F/N_B$ instances among the available $N_{ins}$ instances. Thus, the total number of distinct frames that the processor 14 constructs for the FER evaluation is $\binom{N_{ins}}{N_F/N_B}$. Generally, a frame is considered error-free if all of the code blocks in the frame have zero errors (e.g., just as if it has a cyclic redundancy check appended). The probability of a particular kth frame being error-free (i.e., $Pr(F_{ef}^k)$) is:

$$Pr(F_{ef}^k) = \prod_{l=1}^{N_F/N_B} \left\{ \sum_{\forall i} Pr(R_{min} = R_i | I, N_a, N_B^I(R_i) = 0) \right\}. \quad \text{Eq. 20.}$$

Accordingly, the overall frame error rate may be computed as:

$$FER = \left[ \sum_{k=1}^{\binom{N_{ins}}{N_F/N_B}} \{1 - Pr(F_{ef}^k)\} \right] / \binom{N_{ins}}{N_F/N_B}. \quad \text{Eq. 21.}$$

Again, in one embodiment, the processor 14 comprises a D-Wave 2000 quantum annealer. It may be advantageous to determine the quantum annealer's system parameters including the coupler strength of an embedding JFerro ($|J_F|$), annealing time $T_a$, number of anneals $N_a$, and the design parameter $W_2$ for evaluating the quantum belief propagation's overall system performance within the quantum annealer. For example, one purpose of embedding is to make qubits agree. Accordingly, a large negative JFerro may be required in order to ensure the embedding is effective. However, the supported range of coupler strengths in the D-Wave 2000 quantum annealer is [−1,1]. Accordingly, the QUBO of coefficients with respect to the JFerro ($|J_F|$) may need to be normalized to bring the coupler strengths into the supported range.

For example, consider a QUBO problem with coupler strengths in the range [A, B]. Then the JFerro ($|J_F|$) should be greater than the max ($|A|, |B|$) to prioritize embeddings over problem couplers and moderate enough to distinguish the new normalized coupler strengths $$\left[\frac{A}{J_F}, \frac{B}{J_F}\right]$$

as the range lessens. The JFerro sensitivity analysis may be performed at a moderate SNR of 8 dB. Using a relatively high anneal time (e.g., $T_a$=299 μs to ensure minimal disturbance from the time limit) and QUBO design parameters of $W_1$=1.0 and $W_2$=6.0, it can be shown that all other values of $W_1$ and $W_2$ may result in similar trends for the JFerro sensitivity.

Figure 13:
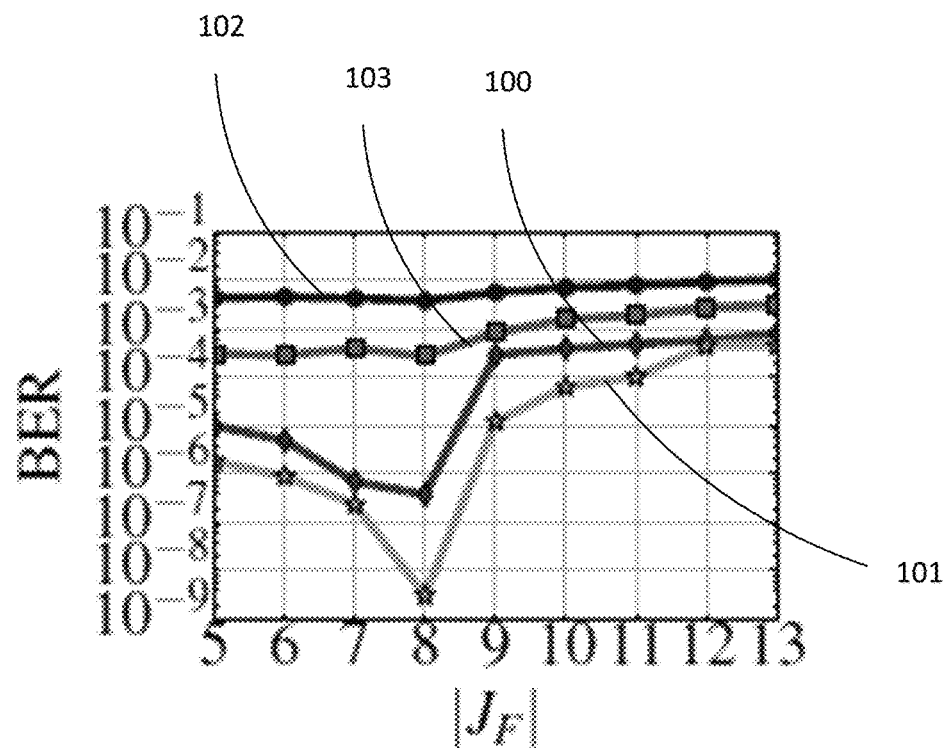
FIGS. 13 and 14 illustrate exemplary bit error rates achieved by the embodiments described herein.

FIG. 13 illustrates the bit error rate of the belief propagation algorithm embedded with the quantum annealer of the processor 14 with various JFerro ($|J_F|$) strengths. For example, when one anneal (i.e., BER curve 102) is, or even 10 anneals (i.e., BER curve 103) are, performed by the quantum annealer, the BER is barely minimized at $|J_F|$=8.0 because the effect of $|J_F|$ with fewer anneals is slight. However, with 50 anneals (i.e., BER curve 100) or even 100 anneals (i.e., BER curve 101) being performed by the quantum annealer, the JFerro ($|J_F|$) minimizes the BER.

The choice of the design parameter $W_2$ can also influence the BER. For example, the LDPC satisfier function of the belief propagation algorithm of Eq. 12 may introduce coupler strengths (i.e., quadratic coefficients) greater than one. These are normalized to bring the problem coupler strengths into the supported [−1, 1] range. By setting $W_1$=1.0 and considering the choice of $W_2$ (i.e., the parameter that determines sensitivity to the received bits used to identify a correct codeword), the optimal value of may be dynamically determined based on a channel's SNR (e.g., the channel 16 of FIG. 1) so as to strike a balance between received soft information and the LDPC code constraints.

Figure 14:
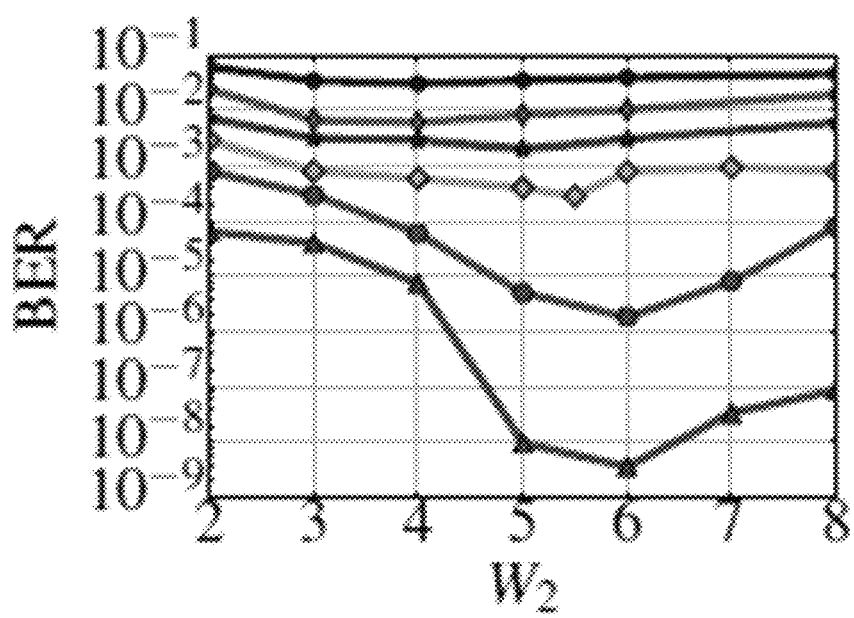

In one embodiment, the $W_2$ sensitivity analysis at $|J_F|$=8.0 uses a relatively high anneal time (e.g., 299 μs) to ensure minimal disturbance from the time limit. An example of such as illustrated in FIG. 14. For example, FIG. 14 illustrates various BER performances at various SNR's while varying the $W_2$ parameter. More specifically, the magnitude of the $W_2$ parameter that minimizes the BER increases with an increase in channel SNR. In this regard, the processor 14 may choose the $W_2$ parameter when LDPC data is being received. As an incoming frame of data arrives, the receiver (e.g., the data buffer 12 and the processor 14) may use the packet preamble to estimate SNR and then look up and optimal $W_2$ parameter for decoding in a lookup table.

Figure 15:
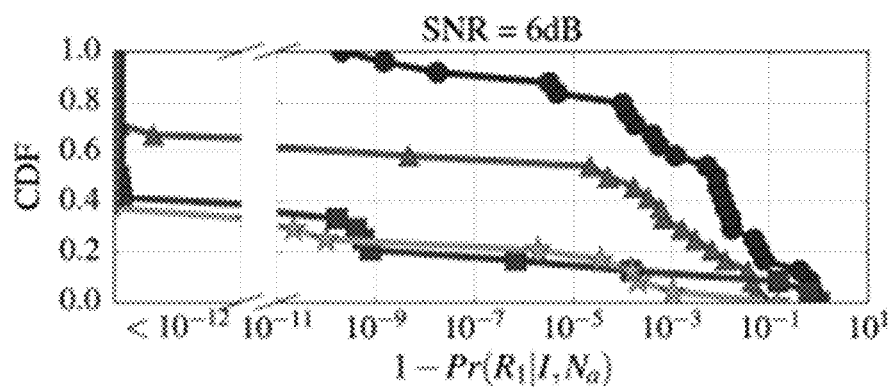
FIGS. 15 and 16 illustrate exemplary choices of anneal times and the probability of not finding a ground truth across a distribution of problem instances.
Figure 16:
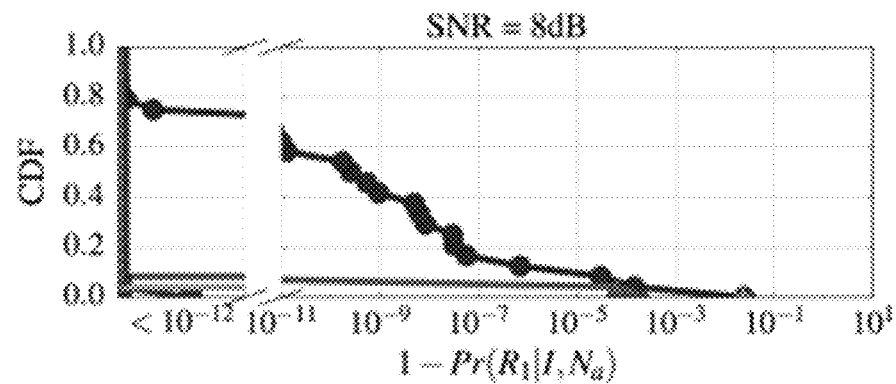
Figure 17:
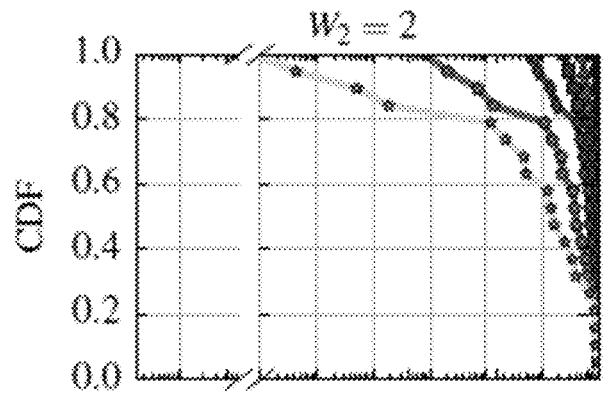
FIGS. 17-20 show exemplary probabilities of not finding a minimum energy solution across the cumulative distribution of problem instances in a wireless channel.
Figure 18:
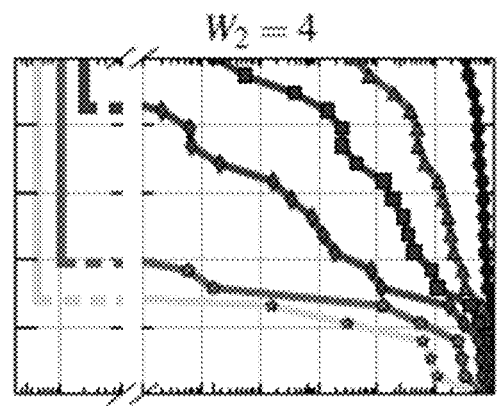
Figure 19:
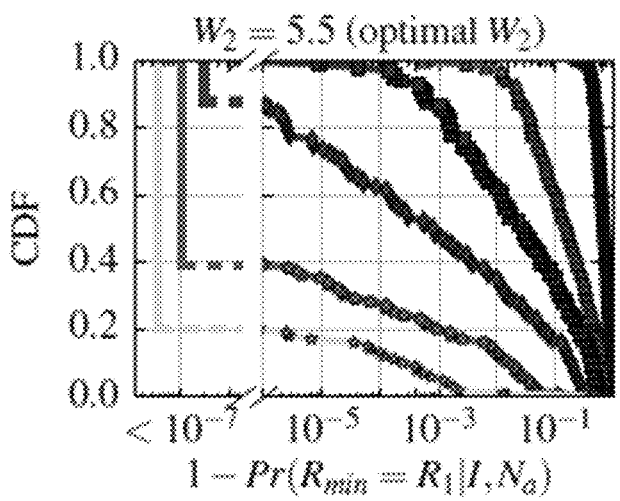
Figure 20:
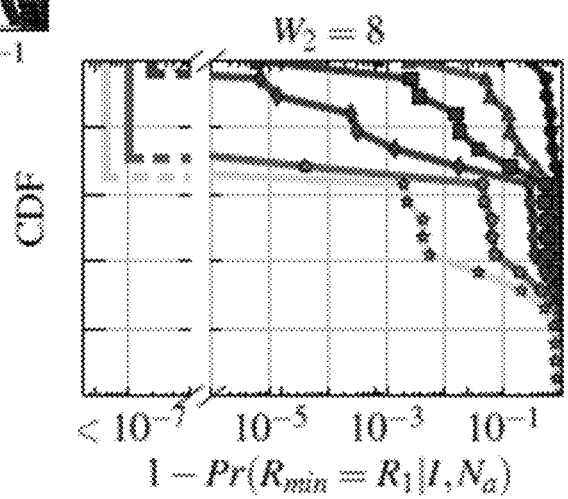

The anneal time $T_a$ may also be sensitive to $|J_F|$. For example, in one actual reduction to practice, the annealing time $T_a$ sensitivity was analyzed with $|J_F|$=8.0 and $W_1$ equal to 1.0. The parameter was selected as before with 10 anneals being performed, although the number of anneals produce similar trends. For example, FIGS. 15 and 16 illustrate the choice of an anneal time $T_a$ and the probability of not finding a ground truth across a distribution of problem instances. An anneal time $T_a$=1 of appears to be sufficient to achieve a relatively high probability of finding the ground truth.

Accordingly, the performance of the belief propagation algorithm in the quantum annealer can be quantified over a total compute time $T_c$ where $T_c$=$N_a \cdot T_a$. FIGS. 17-20 show the probability of not finding the minimum energy solution across the cumulative distribution of problem instances in a wireless channel with a 6 dB SNR over various choices of $W_2$ and computing times $T_c$. These figures illustrate that the optimal choice of $W_2$ results in a relatively low possibility of not finding a ground truth as well as the benefits of increasing the compute time $T_c$ up to 100 μs.

The performance of the quantum annealer embedded with the belief propagation algorithm of the LDPC code can also be experimentally evaluated. For example, in one actual reduction of practice, the performance of the quantum annealer of the processor 14 is evaluated over a Gaussian wireless channel at SNRs in the range of 1 to 11 dB. These evaluations were compared against soft belief propagation decoders operating within various iteration count limits. At SNRs of greater than 6 dB, the quantum annealer of the processor 14 outperformed conventional soft belief propagation decoders operating at 20 to 100 iterations. For example, the quantum annealer of the processor 14 is operable to obtain a BER of $10^{-8}$ at an SNR between about 7.5 dB and 8.5 dB, whereas the conventional soft belief propagation decoders were only able to achieve a comparable BER at an SNR of 10.5 dB to 11 dB. This is generally due to the fact that the optimal choice of $W_2$ at relatively high SNRs is high, separating the ground truth with a relatively high energy gap to make the transmitted message easier to distinguish.

FER performance was also evaluated. For example, with frame sizes $N_F$ of 420 and 12,000 bits, the quantum annealer of the processor 14 is able to obtain an FER of $10^{-6}$ for signals between about 8 dB and 9 dB.

Figure 21:
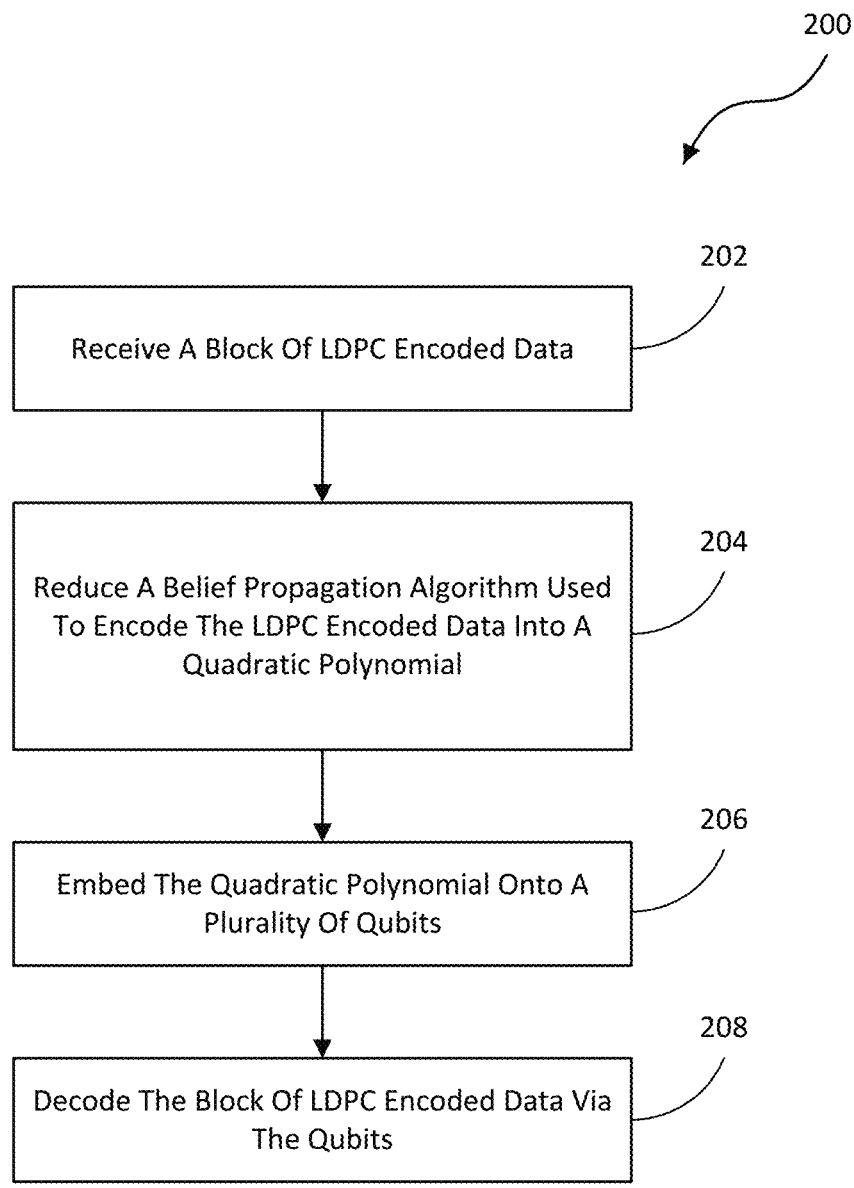
FIG. 21 is a flowchart of an exemplary process of the system for decoding LDPC encoded data.

FIG. 21 is a flowchart of an exemplary process 200 of the system 10 of FIG. 1 for decoding LDPC encoded data. In this embodiment, the data buffer 12 first receives a block of LDPC encoded data, in the process element 202. For example, the data buffer 12 may be part of a processing system which receives LDPC encoded data through a channel 16. The channel may be representative of a variety of communication links that may be influenced by noise that creates errors in the LDPC encoded data. Examples of such again include electronic communication links between electronic components (e.g., computer buses, system buses, etc.), RF communication links between transmitters and receivers (e.g., satellite communications systems, line of sight communications systems, cellular and mobile telephony systems, etc.), optical communication links, magnetic communication links (e.g., read/write heads interfacing with a magnetic disk and a hard disk drive), reads from memory cells and flash memory devices, and the like.

The processor 14 may decode the LDPC encoded data using a quantum annealer. For example, the LDPC encoded data is generally encoded via a belief propagation algorithm. The processor 14 may be operable to reduce the belief propagation algorithm into a quadratic polynomial, in the process element 204, e.g., comprising an LDPC satisfier function and an LDPC distance function, such as those described in Eqs. 11-15. The processor 14, and more specifically the quantum annealer, may embed the quadratic polynomial onto a plurality of qubits, in the process element 206. And, based on this embedding, the processor 14 may decode the block of LDPC encoded data via the qubits, in the process element 208, as described hereinabove.

Figure 22:
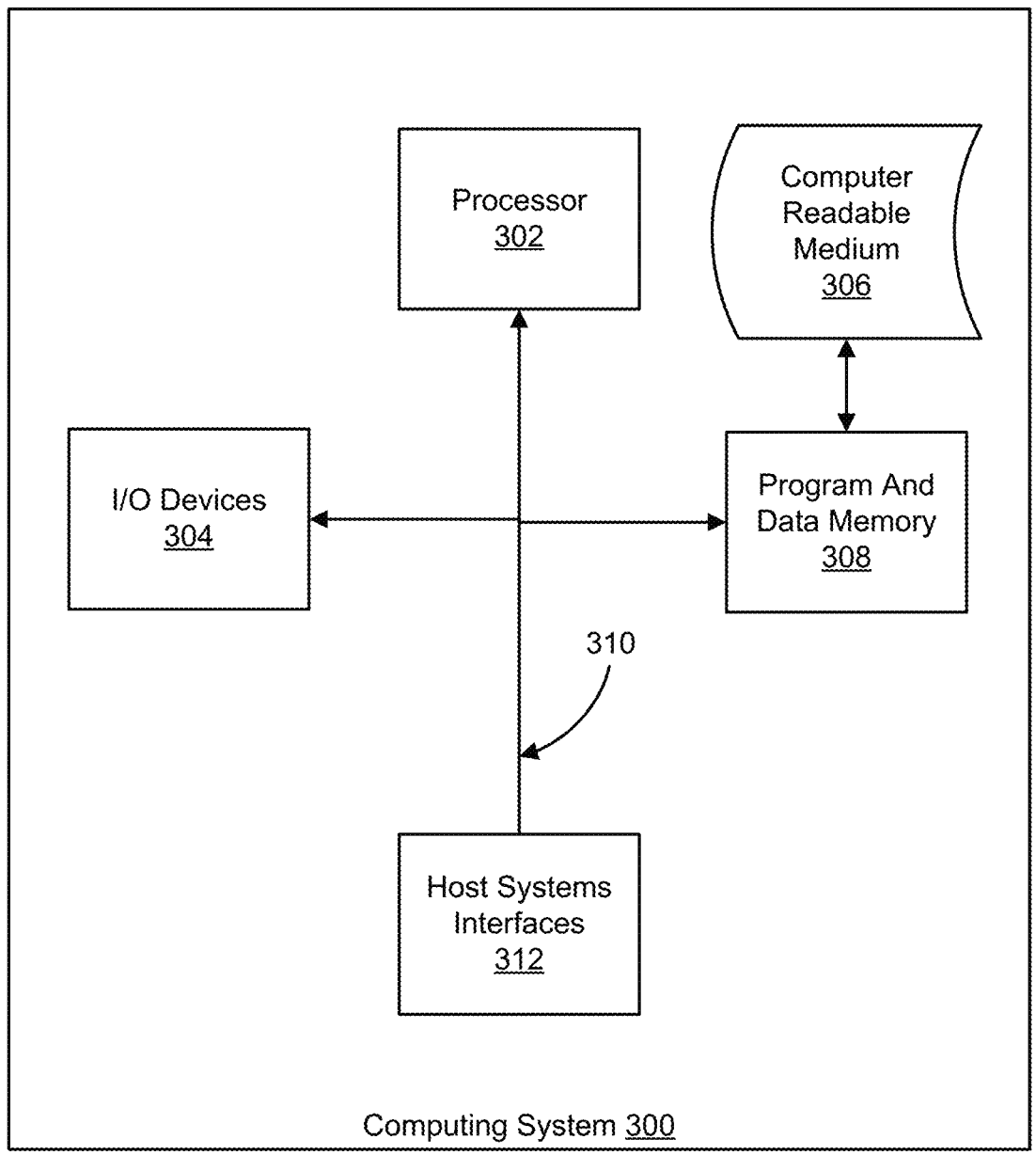
FIG. 22 is a block diagram of an exemplary computing system in which a computer readable medium provides instructions for performing methods herein.

Any of the above embodiments herein may be rearranged and/or combined with other embodiments. Accordingly, the concepts herein are not to be limited to any particular embodiment disclosed herein. Additionally, the embodiments can take the form of entirely hardware or comprising both hardware and software elements. Portions of the embodiments may be implemented in software, which includes but is not limited to firmware, resident software, microcode, etc. FIG. 22 illustrates a computing system 300 in which a computer readable medium 306 may provide instructions for performing any of the methods disclosed herein.

Furthermore, the embodiments can take the form of a computer program product accessible from the computer readable medium 306 providing program code for use by or in connection with a computer or any instruction execution system. For the purposes of this description, the computer readable medium 306 can be any apparatus that can tangibly store the program for use by or in connection with the instruction execution system, apparatus, or device, including the computer system 300.

The medium 306 can be any tangible electronic, magnetic, optical, electromagnetic, infrared, or semiconductor system (or apparatus or device). Examples of a computer readable medium 306 include a semiconductor or solid state memory, magnetic tape, a removable computer diskette, a random access memory (RAM), NAND flash memory, a read-only memory (ROM), a rigid magnetic disk and an optical disk. Some examples of optical disks include compact disk-read only memory (CD-ROM), compact disk-read/write (CD-R/W) and digital versatile disc (DVD).

The computing system 300, suitable for storing and/or executing program code, can include one or more processors 302 coupled directly or indirectly to memory 308 through a system bus 310. The memory 308 can include local memory employed during actual execution of the program code, bulk storage, and cache memories which provide temporary storage of at least some program code in order to reduce the number of times code is retrieved from bulk storage during execution. Input/output or I/O devices 304 (including but not limited to keyboards, displays, pointing devices, etc.) can be coupled to the system either directly or through intervening I/O controllers. Network adapters may also be coupled to the system to enable the computing system 300 to become coupled to other data processing systems, such as through host systems interfaces 312, or remote printers or storage devices through intervening private or public networks. Modems, cable modem and Ethernet cards are just a few of the currently available types of network adapters.

What is claimed is:

1. An error correction system, comprising:
a data buffer operable to receive a block of Low Density Parity Check (LDPC) encoded data; and
a processor that reduces a belief propagation algorithm into a quadratic polynomial, the belief propagation algorithm being used to decode the LDPC encoded data, with the processor further mapping the quadratic polynomial onto a plurality of quantum bits (qubits) to embed the quadratic polynomial onto the qubits, and decoding the block of LDPC encoded data via the qubits with the quadratic polynomial to output a block of LDPC decoded data.

2. The error correction system of claim 1, wherein:
the quadratic polynomial comprises a satisfier function operable to determine parity check solutions that satisfy constraints of an LDPC error correction code.

3. The error correction system of claim 2, wherein:
the processor is further operable to embed each constraint of the LDPC error correction code onto a single qubit.

4. The error correction system of claim 2, wherein:
the processor is further operable to embed at least one of the constraints of the LDPC error correction code onto at least a portion of the qubits.

5. The error correction system of claim 2, wherein:
the quadratic polynomial comprises a distance function operable to determine proximities of the parity check solutions to the block of LDPC encoded data.

6. The error correction system of claim 1, wherein:
the data buffer is communicatively coupled to a data channel operable to convey the LDPC encoded data to the data buffer; and
the channel comprises at least one of a radio frequency communication link, an optical communication link, an electronic communication link, flash memory cells, or a magnetic storage medium.

7. The error correction system of claim 1, wherein:
the processor comprises a quantum annealer.

8. A method of error correction, comprising:
receiving a block of Low Density Parity Check (LDPC) encoded data;
reducing a belief propagation algorithm into a quadratic polynomial, the belief propagation algorithm being used to decode the LDPC encoded data;
mapping the quadratic polynomial onto a plurality of quantum bits (qubits) to embed the quadratic polynomial onto the qubits; and
decoding the block of LDPC encoded data via the qubits with the quadratic polynomial to output a block of LDPC decoded data.

9. The method of claim 8, further comprising:
determining parity check solutions that satisfy constraints of an LDPC error correction code with a satisfier function of the quadratic polynomial.

10. The method of claim 9, further comprising:
embedding each constraint of the LDPC error correction code onto a single qubit.

11. The method of claim 9, further comprising:
embedding at least one of the constraints of the LDPC error correction code onto at least a portion of the qubits.

12. The method of claim 9, further comprising:
determining proximities of the parity check solutions to the block of LDPC encoded data via a distance function of the quadratic polynomial.

13. The method of claim 8, wherein receiving the LDPC encoded data further comprises:
receiving the LDPC encoded data through a data channel comprising at least one of a radio frequency communication link, an optical communication link, an electronic communication link, flash memory cells, or a magnetic storage medium.

14. The method of claim 8, wherein:
the qubits are configured with a quantum annealer.

15. A non-transitory computer readable medium comprising instructions that, when executed in a processor comprising a quantum annealer, direct the processor to correct errors in LDPC encoded data, the instructions further directing the processor to:
receive a block of Low Density Parity Check (LDPC) encoded data;
reduce a belief propagation algorithm into a quadratic polynomial, the belief propagation algorithm being used to decode the LDPC encoded data into;
mapping the quadratic polynomial onto a plurality of quantum bits (qubits) to embed the quadratic polynomial onto the qubits; and
decode the block of LDPC encoded data via the qubits with the quadratic polynomial to output a block of LDPC decoded data.

16. The computer readable medium of claim 15, further comprising instructions that direct the processor to:
  determine parity check solutions that satisfy constraints of an LDPC error correction code with a satisfier function of the quadratic polynomial.

17. The computer readable medium of claim 16, further comprising instructions that direct the processor to:
  embed each constraint of the LDPC error correction code onto a single qubit.

18. The computer readable medium of claim 16, further comprising instructions that direct the processor to:
  embed at least one of the constraints of the LDPC error correction code onto at least a portion of the qubits.

19. The computer readable medium of claim 16, further comprising instructions that direct the processor to:
  determine proximities of the parity check solutions to the block of LDPC encoded data via a distance function of the quadratic polynomial.

20. The computer readable medium of claim 15, wherein the instructions that direct the processor to receive the LDPC encoded data further comprise instructions that direct the processor to:
  receive the LDPC encoded data through a data channel comprising at least one of a radio frequency communication link, an optical communication link, an electronic communication link, flash memory cells, or a magnetic storage medium.

21. The computer readable medium of claim 15, wherein:
  the processor comprises a quantum annealer.

* * * * *